United States Patent
Kennan et al.

(10) Patent No.: US 11,601,202 B2
(45) Date of Patent: Mar. 7, 2023

(54) ACTIVE BIAS CIRCUIT

(71) Applicant: MACOM Technology Solutions Holdings, Inc., Lowell, MA (US)

(72) Inventors: Wayne Kennan, Palo Alto, CA (US); Toshi Omori, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/365,374

(22) Filed: Jul. 1, 2021

(65) Prior Publication Data

US 2022/0006533 A1 Jan. 6, 2022

Related U.S. Application Data

(60) Provisional application No. 63/046,899, filed on Jul. 1, 2020.

(51) Int. Cl.
*H04B 10/564* (2013.01)
*H03H 7/06* (2006.01)
*H04B 10/50* (2013.01)

(52) U.S. Cl.
CPC .............. *H04B 10/564* (2013.01); *H03H 7/06* (2013.01); *H04B 10/504* (2013.01)

(58) Field of Classification Search
CPC .. H01S 5/0428; H01S 5/06226; H01S 5/0265; H02M 1/08; H02M 3/158; H02M 3/156; H02M 1/0025; H03K 4/08; H04B 10/564; H04B 10/504; H04B 10/50595; H04B 10/50575; H03H 7/06

(Continued)

(56) References Cited

U.S. PATENT DOCUMENTS 5,305,469 A * 4/1994 Camiade .............. G01S 13/825
342/51
6,927,640 B2 * 8/2005 Gomez .................. H03B 5/364
331/116 R (Continued)

FOREIGN PATENT DOCUMENTS

EP 1381036 A2 * 1/2004 ........... G11B 7/0062
EP 1381036 A2 1/2004

(Continued)

OTHER PUBLICATIONS

International Search Report and Written Opinion for PCT/US2021/040069 dated Feb. 16, 2022.

*Primary Examiner* — Abbas H Alagheband
(74) *Attorney, Agent, or Firm* — Perilla Knox & Hildebrandt LLP; Jason M. Perilla

(57) ABSTRACT

Active bias circuits for integrated devices are described. In one example, an active bias circuit includes a voltage control element to establish a control voltage, an active bias device to provide a power bias responsive to the control voltage, and a compensation circuit connected to the active bias device. The compensation circuit can be configured to set output impedance and compensate for parasitic capacitance of the active bias device. In another embodiment, the voltage control element can be omitted, and a control voltage can be relied upon to directly control the power bias output provided by the active bias device. The active bias circuit can be used to power a driver of an integrated optical transmitter, in one example, among other possible applications.

20 Claims, 7 Drawing Sheets

(58) Field of Classification Search
USPC .......................................................... 398/182
See application file for complete search history.

(56) References Cited

U.S. PATENT DOCUMENTS

| | | | | |
|---|---|---|---|---|
| 7,852,168 | B1* | 12/2010 | Song | H03L 7/099 |
| | | | | 331/185 |
| 9,450,568 | B1* | 9/2016 | Hawkins | H03K 17/162 |
| 9,722,552 | B2* | 8/2017 | Kobayashi | H03F 3/345 |
| 2003/0002550 | A1* | 1/2003 | Schemmann | H01S 5/042 |
| | | | | 372/38.02 |
| 2004/0095853 | A1* | 5/2004 | Masui | G11B 7/1263 |
| 2006/0007841 | A1* | 1/2006 | Masui | G11B 7/0062 |
| | | | | 369/116 |
| 2006/0087374 | A1* | 4/2006 | Khanifar | H03F 3/60 |
| | | | | 330/151 |
| 2007/0036059 | A1* | 2/2007 | Masui | G11B 7/0062 |
| | | | | 369/116 |
| 2008/0048783 | A1* | 2/2008 | Shimomura | H03F 1/30 |
| | | | | 330/296 |
| 2012/0106981 | A1* | 5/2012 | Moto | H03K 17/6871 |
| | | | | 398/201 |
| 2014/0126596 | A1* | 5/2014 | Moto | H01S 5/068 |
| | | | | 372/38.02 |
| 2016/0191196 | A1* | 6/2016 | Troiani | H04Q 11/0066 |
| | | | | 398/52 |
| 2018/0054171 | A1* | 2/2018 | Pehlivanoglu | H03F 3/193 |
| 2020/0395898 | A1* | 12/2020 | Wang | H03F 3/19 |
| 2022/0006533 | A1* | 1/2022 | Kennan | H04B 10/564 |

FOREIGN PATENT DOCUMENTS

| | | | | |
|---|---|---|---|---|
| EP | 2180564 | A1 | 4/2010 | |
| JP | 2003017934 | A * | 1/2003 | |
| JP | 2005505179 | A * | 2/2005 | ............... H03H 7/06 |
| JP | 4108400 | B2 * | 6/2008 | ........... G02F 1/0123 |
| JP | 2009032736 | A * | 2/2009 | |
| JP | 2009032736 | A | 2/2009 | |
| KR | 20150105889 | A * | 9/2015 | ........... G11B 7/0062 |
| KR | 20150105889 | A | 9/2015 | |

* cited by examiner

ACTIVE BIAS CIRCUIT

CROSS REFERENCE TO RELATED APPLICATIONS

This application claims priority to U.S. Provisional Application No. 63/046,899, filed Jul. 1, 2020, titled "Active Bias Circuit," the entire contents of which is hereby incorporated herein by reference.

BACKGROUND

An optical communications link can be realized as a single end-to-end optical circuit. An optical fiber is one example of an optical link. In many cases, optical fibers are flexible, transparent fibers made by drawing glass or plastic to a suitably small diameter. Optical fibers can be used as a means to transmit light in fiber-optic communications and to permit data transmission over relatively longer distances and at relatively higher bandwidths than wire cables. Optical fibers are also preferable in some cases because signals travel along them with less loss and without electromagnetic interference.

Optical devices can be integrated with electronic components using semiconducting materials and semiconductor manufacturing techniques in silicon photonics. Silicon photonics devices can be relied upon to communicate data between optical transmitters and receivers over optical communications links. In an optical transmitter, data is used to modulate light, such as that produced by a light or laser emitting diode, and the modulated light can be transmitted to an optical receiver over waveguides, fiber optic cables, etc. Modulated light streams (e.g., optical data streams) are more suitable for long distance, low loss data transmission as compared to data transmitted in the electrical domain.

Electrical current is converted in optical transmitters to optical power, and optical power is converted in optical receivers back to electrical current. In various modulation schemes, the magnitudes of the currents are proportional to the corresponding levels of optical power. Similar to other electronic circuitry, the drivers and amplifiers in silicon photonics and other optical integrated devices depend upon correct power sourcing and biasing for operations.

SUMMARY

Active bias circuits for integrated devices are described. In one example, an active bias circuit includes a voltage control element to establish a control voltage, an active bias device to provide a power bias responsive to the control voltage, and a compensation circuit connected to the active bias device. The compensation circuit can be configured to set output impedance and compensate for parasitic capacitance of the active bias device. In another embodiment, the voltage control element can be omitted, and a control voltage can be relied upon to directly control the power bias output provided by the active bias device. The active bias circuit can be used to power a driver of an integrated optical transmitter, among other possible applications.

In one example, an active bias circuit includes a voltage control element to establish a control voltage, an active bias device to provide a power bias from a power supply based on the control voltage, and a compensation circuit coupled to receive the power bias from the active bias device, the compensation circuit configured to set an output impedance of the active bias circuit and to compensate for parasitic capacitance of the active bias device.

The active bias circuit can also include a current source connected in series with the voltage control element, to establish the control voltage across the voltage control element. The active bias circuit can also include a high-pass filter between the voltage control element and the active bias device, with the high-pass filter setting low frequency operation for the active bias circuit.

In other aspects, the active bias circuit can include an active bias transistor, and the high-pass filter can include a resistor-capacitor (RC) network between the voltage control element and a gate of the active bias transistor. The compensation circuit of the active bias circuit can also include a parallel arrangement of a resistor and an inductor in some cases.

In other aspects, the active bias circuit can also include a bypass resistor coupled in parallel with the active bias device. The voltage control element can also include a voltage control resistor, and a resistance of the voltage control resistor can be greater than a resistance of the bypass resistor. The active bias circuit can also include a low frequency shunt and a high frequency shunt coupled between the power supply and ground.

In another example, an optical transmitter includes a laser diode, a driver configured to provide a driving bias to the laser diode based on input data, and a bias circuit configured to provide a power bias to the driver. The bias circuit includes a voltage control element to establish a control voltage, and an active bias device to provide the power bias to the driver based on the control voltage. The voltage control element can be a controller or processor in one example.

In other aspects, the optical transmitter can also include a compensation circuit coupled between the active bias device and the driver. The compensation circuit can include a parallel arrangement of a resistor and an inductor. The compensation circuit can be configured to set an output impedance of the active bias device and to compensate for parasitic capacitance of the active bias device.

In other aspects, the optical transmitter can include a current source connected in series with the voltage control element, to establish the control voltage across the voltage control element. The optical transmitter can also include a high-pass filter between the voltage control element and the active bias device, with the high-pass filter setting low frequency operation for the active bias device.

In other aspects, the bias circuit can include an active bias transistor, and the high-pass filter can include a resistor-capacitor (RC) network between the voltage control element and a gate of the active bias transistor. The bias circuit can also include a bypass resistor coupled in parallel with the active bias device. In other aspects, the voltage control element can include a voltage control resistor, and a resistance of the voltage control resistor can be greater than a resistance of the bypass resistor.

In another example, an active bias circuit includes a voltage control element, a current source connected in series with the voltage control element, to establish a control voltage across the voltage control element, an active bias device to provide a power bias from a power supply based on the control voltage, a high-pass filter coupled between the voltage control element and the active bias device, and a compensation circuit coupled to receive the power bias from the active bias device, where the compensation circuit is configured to set an output impedance of the active bias circuit and to compensate for parasitic capacitance of the active bias device. The compensation circuit can include a parallel arrangement of a resistor and an inductor.

BRIEF DESCRIPTION OF THE DRAWINGS

The components in the drawings are not necessarily to scale, emphasis instead being placed upon illustrating the principles of the invention. In the drawings, like reference numerals designate corresponding parts throughout the different views.

DETAILED DESCRIPTION

Integrated optical communication systems are commonly found in data centers and for long haul applications to transmit data at high data rates between two locations. Many optical communication systems rely upon driver amplifiers to amplify the modulating signal onto an optical modulator or directly drive a laser diode. Among other circuitry in such integrated optical communication systems, the driver amplifiers rely upon proper power biasing for suitable operations.

Integrated optical transmitters in optical communications systems rely upon a regulated and constant source of power or power bias for operation. Conventional power bias circuitry in optical transmitters have relied, in part, upon bias chokes to supply a regulated power bias to drivers, modulators, and laser diodes in integrated optical transmitters. Due to size, complexity, and other factors, these bias chokes have been unsuitable for integration with the remaining components of integrated optical transmitters.

In the context of these and other problems with bias circuits, new types of active bias circuits for integrated devices are described herein. In one example, an active bias circuit includes a voltage control element to establish a control voltage, an active bias device to provide a power bias responsive to the control voltage, and a compensation circuit connected to the active bias device. The compensation circuit can be configured to set output impedance and compensate for parasitic capacitance of the active bias device. In another embodiment, the voltage control element can be omitted, and a control voltage can be relied upon to directly control the power bias output provided by the active bias device. The active bias circuit can be used to power a driver of an integrated optical transmitter, in one example, among other possible applications.

Figure 1:
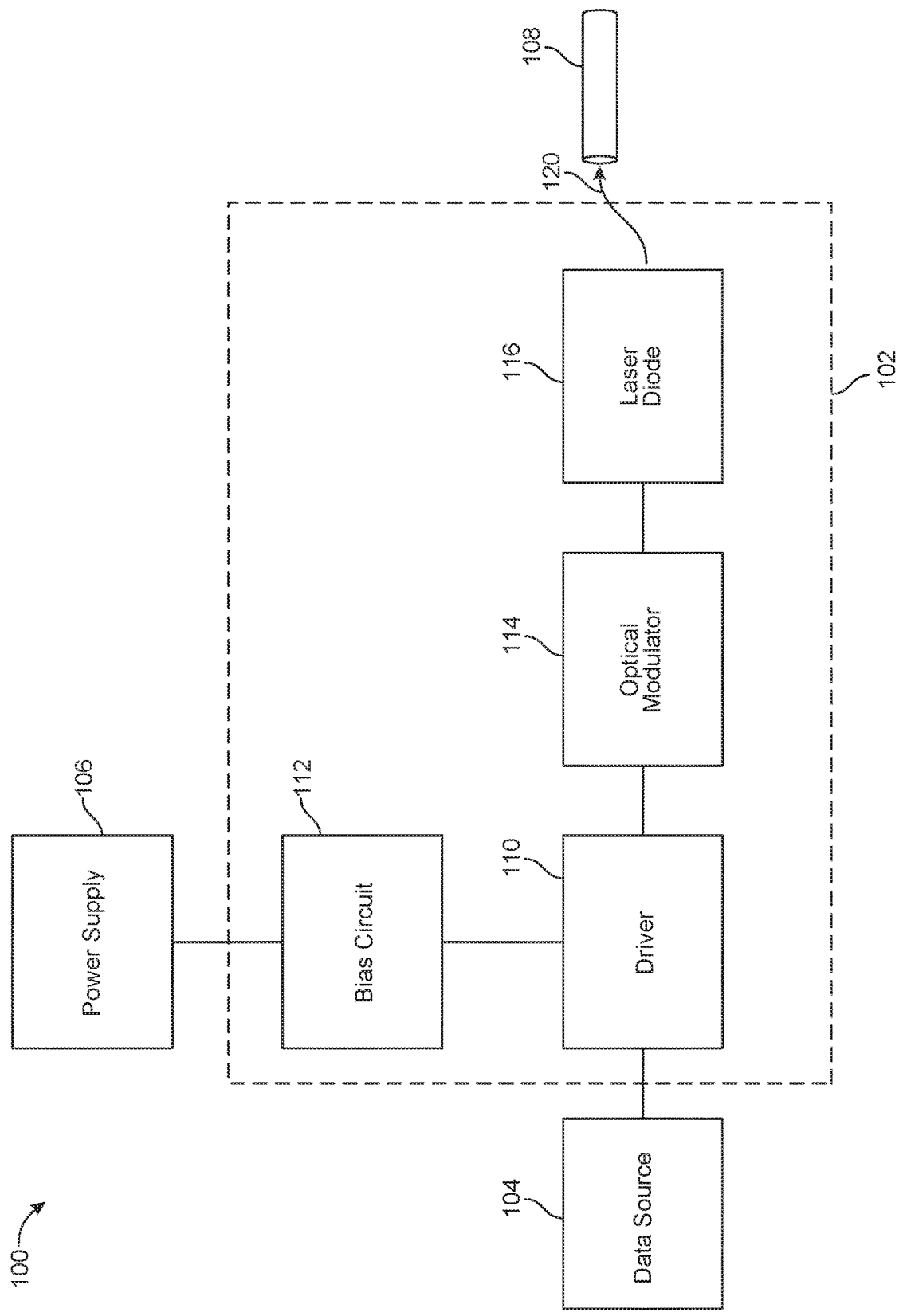
FIG. 1 illustrates an example optical data communications system according to various aspects of the embodiments described herein.

Turning to the drawings, FIG. 1 illustrates an example optical data communications system 100 according to various aspects of the embodiments described herein. FIG. 1 is representative, and the concepts described herein can be applied to other integrated optical devices and systems. FIG. 1 does not necessarily illustrate all circuit components or features that may be present in practice, and one or more of the components shown in FIG. 1 can be omitted in some cases.

Among possibly other components, the system 100 includes an optical transmitter 102, a data source 104, a power supply 106, and an optical communications link 108. As described in further detail below, the optical transmitter 102 can be embodied as an integrated optical transmitter chip or device. In one example, the optical transmitter 102 is configured to generate one or more laser tones, impress high speed digital modulation upon the tones, and multiplex the modulated tones for coupling to the optical communications link 108 and transmission to a receiver.

In various examples, the optical transmitter 102 can be packaged in a standard form factor package, such as a complete Transmitter Optical Subassembly (TOSA), Quad Small Form-Factor Pluggable (QSFP) form factor package, or other suitable package or form factor. The optical transmitter 102 can also be mounted directly on a system circuit board in a method known as chip-on-board, although other packages and implementations are within the scope of the embodiments.

The data source 104 provides data, in the form of an electrical signal, to the optical transmitter 102 for optical conversion, modulation, and communication over the optical communications link 108. The data from the data source 104 can be of any suitable form (e.g., voltage levels, speed, frequency, etc.) and format (e.g., coding format) for optical conversion and transmission by the optical transmitter 102.

The data source 104 can be embodied as any source of data for communication. As examples, the data source 104 can be embodied as a general purpose data processor or processing circuit, with memory, or an application specific integrated circuit (ASIC) control chip or device, with memory, although other processing devices can be relied upon. The data source 104 can interface with the optical transmitter 102 over one or more local interfaces, such as serial interfaces, parallel interfaces, and combinations thereof.

The power supply 106 can be embodied as any suitable power supply for the optical transmitter 102. The power supply 106 can generate sufficient power, at any voltage and current, to support the operations of the internal circuitry of the optical transmitter 102. In some cases, the power supply 106 can also supply power to the data source 104 and other components.

The optical communications link 108 can be embodied as one or more optical fibers capable of carrying light, such as the modulated light generated by the optical transmitter 102. As examples, the optical communications link 108 can be embodied as one or more single- or multi-mode optical fibers of any length in various embodiments. The optical communications link 108 can be coupled between the optical transmitter 102 and an optical receiver, which is not shown in FIG. 1.

Turning back to the optical transmitter 102, the optical transmitter 102 includes a driver 110, a bias circuit 112, an optical modulator 114, and a laser diode 116. The driver 110, bias circuit 112, optical modulator 114, and laser diode 116 can be integrated together on a single semiconductor chip, or divided among a number of different chips in various embodiments. In some cases, the optical transmitter 102 can include other elements or components, such as one or more controllers, optical multiplexers, photodetectors, or other components not shown in FIG. 1. In other cases, the optical transmitter 102 can omit one or more of the elements shown in FIG. 1.

The driver 110 can be embodied as an integrated circuit device capable of one or more of high speed input data recovery, data reconstruction and conditioning, data clock recovery and retiming, and driving bias and modulation output (e.g., current and/or voltage driving bias output), although it is not necessary for the driver 110 to incorporate all of those features. One or more channels of input data can be provided to the driver 110 from the data source 104. In some cases, to recover and reconstruct the underlying data from the data source 104, the driver 110 can include adaptive or programmable input buffers, filters, equalizers, etc.

The driver 110 can also include an adaptive or programmable clock and data recovery (CDR) circuit in some cases. The CDR can be configured to extract a high-speed clock from the input data and retime the data with the extracted clock. In that way, the CDR can remove jitter from the input data and improve data communications. As one example, the CDR can programmatically retime each channel of the input data to a certain bitrate. The CDR can also provide a monitor clock output and other signals and information.

The driver 110 also includes driver circuitry configured to provide bias and/or modulation power to the optical modulator 114, the laser diode 116, or both. Particularly, based on the data received from the data source 104, the driver circuitry in the driver 110 can provide bias and/or modulation power (e.g., bias and/or modulation voltages or currents) to the optical modulator 114, the laser diode 116, or both. The driver circuitry can be programmed to provide a range of bias and/or modulation voltages or currents, in certain increments, in some cases. The driver 110 can also be programmed to provide a range of bias power to the laser diodes 116 based on the types and operating characteristics of the laser diodes 116.

The laser diode 116 can be embodied as one or more laser diode transmitters, photonic integrated circuit (PIC) laser transmitters, light emitting diode transmitters, or related optical transmitters. As one example, the laser diode 116 can be embodied as one or more Distributed Feedback (DFB) laser diodes coupled to the optical modulator 114, although the laser diode 116 can be embodied as other types of light emitting or laser diodes (e.g., VCSELs, etc.) formed through any suitable manufacturing techniques. The laser diode 116 can also be embodied as one or more Electro-absorption Modulated Lasers (EMLs), or one or more Directly Modulated Lasers (DMLs), in which case the optical modulator 114 can be omitted. Other types of light emitting or laser diodes can be relied upon for the laser diode 116.

The optical modulator 114 can be configured to modulate the light output by the laser diode 116, and the modulated light is optically coupled to the optical communications link 108 for transmission to an optical receiver. The optical modulator 114 can be embodied as one or more optical modulators of any suitable type. In one example, the output of the laser diode 116 can be coupled back to the optical modulator 114 using optical waveguides in the optical transmitter 102, for example, and the optical modulator 114 can be configured to modulate the light at the direction of the driver 110. Thus, in some cases, the laser diode 116 is not directly modulated. In other cases, the concepts described herein can be applied to EMLs or DMLs, and the laser diode 116 can be directly modulated using a modulating voltage or current provided by the driver 110. In this case, the optical modulator 114 could be omitted.

In response to drive signals from the driver 110, the optical modulator 114 and the laser diode 116 generate a modulated optical signal 120, which is presented to the optical communications link 108, for transmission to a remote location, such as another device in a data center or a remote location in long-haul applications. The optical data communications system 100 is not limited to any particular type of application or purpose, however, and it can be used in a range of different communications scenarios.

The bias circuit 112 is configured to output a constant and known supply of power (e.g., voltage and current) to the driver 110. A number of features and aspects of the bias circuit 112 are described in further detail below, to improve on the design and operation of the bias circuit 112 for the optical transmitter 102. Among other components, bias chokes have been used in bias circuits such as the bias circuit 112, to help output a constant supply of power to drivers in optical transmitters. Bias chokes have typically been implemented external to the optical transmitters, due to their relatively large size, difficultly to miniaturize, and for other reasons.

Figure 2A:
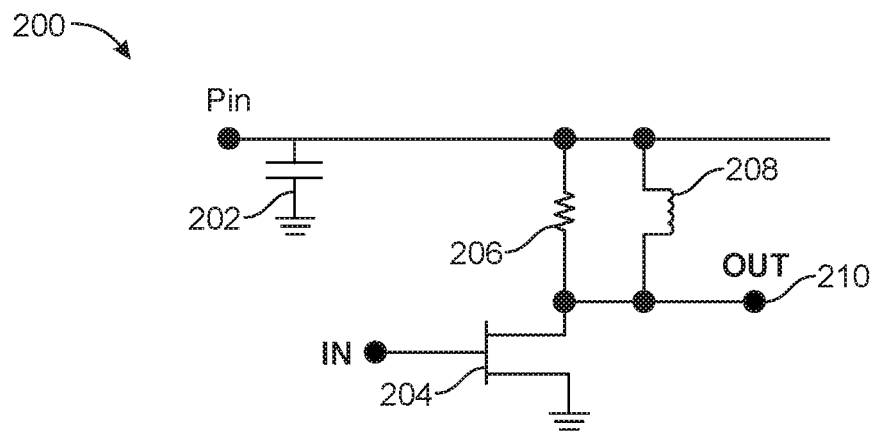
FIG. 2A illustrates an example circuit diagram of a bias circuit including a bias choke.

FIG. 2A illustrates an example circuit diagram of a bias circuit 200 including a bias choke. The bias circuit 200 shown in FIG. 2A can be used as the bias circuit 112 in the system 100 shown in FIG. 1, as one example, although alternative and preferred bias circuits are described in further detail below with reference to FIGS. 3, 4A, 4B, and 4C. The bias circuit 200 includes a power input node Pin, a capacitor 202, an amplifier 204, a resistor 206, a bias choke 208, and an output 210. The amplifier 204 can be embodied as a common source transistor, as shown, having an input terminal and an output terminal. The output terminal of the amplifier 204 is also the same as the output 210 for the bias circuit 200. The capacitor 202 is electrically coupled from the power input node Pin of the bias circuit 200 to ground, as a short or shunt to ground for high frequency signals, while allowing DC power to pass to the amplifier 204.

The resistor 206 and the bias choke 208 are electrically coupled between the power input node Pin and the output 210 of the bias circuit 200. The impedance value of the resistor 206 can be selected to establish an output impedance matched to the optical modulator 114, the laser diode 116, or both, for example.

The bias choke 208 can be embodied as one or more inductors of suitable types and inductances to reduce the magnitude and extent of high frequency signals at the output 210 of the bias circuit 200. In some cases, the bias choke 208 can be embodied as a combination of high and low frequency inductors. Due to size, complexity, and other factors, the bias choke 208 of the bias circuit 200 may be unsuitable for integration with the remaining components of the optical transmitter 102, either on the same semiconductor chip or even in the same integrated package with the optical transmitter 102. The bias choke 208 can also be relatively expensive in many cases. For this and other reasons, the bias circuit 200 may not be preferred for more modern applications and designs.

Figure 2B:
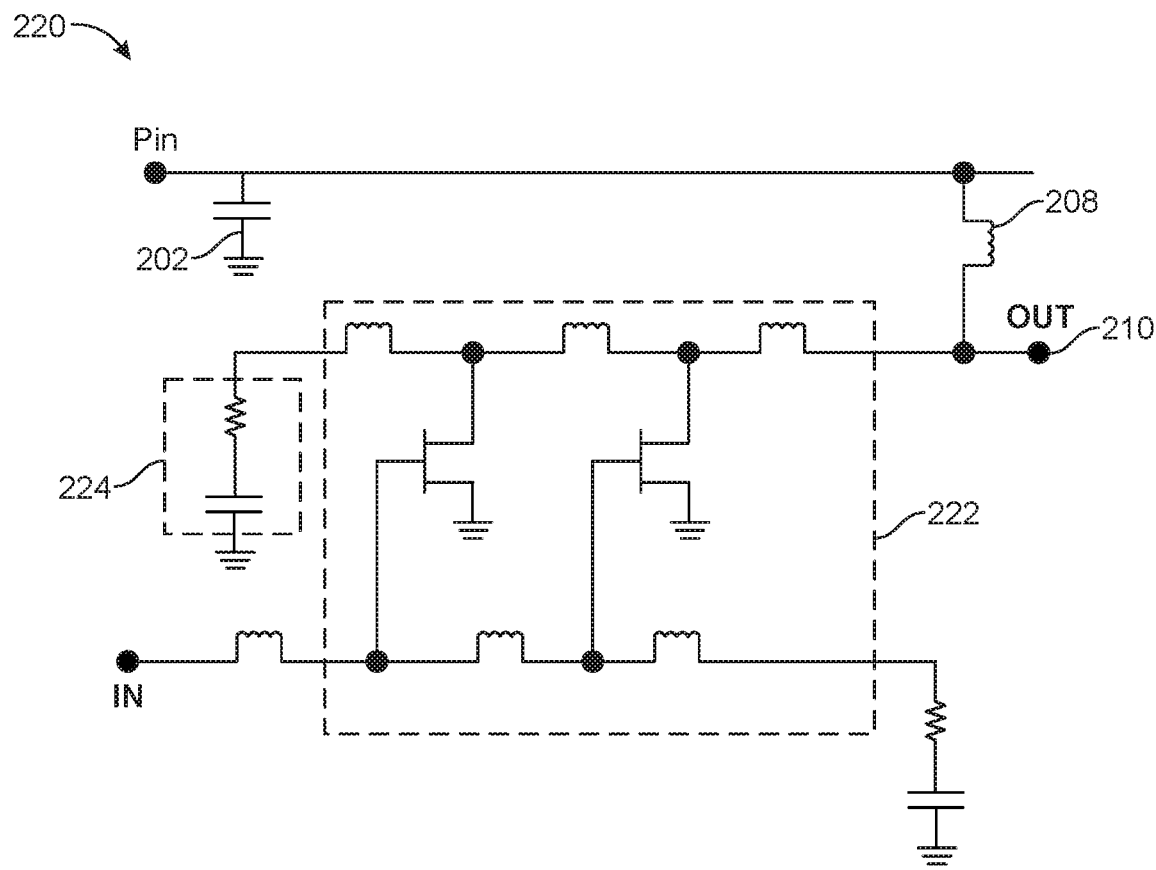
FIG. 2B illustrates an example circuit diagram of a bias circuit including a bias choke that provides power to distributed amplifier.

FIG. 2B illustrates an example circuit diagram of a bias circuit 220 including a bias choke that provides power to distributed amplifier 222. As compared to FIG. 2A, the same or similar elements are identified with the same reference numbers. The bias circuit 220 in FIG. 2B includes a distributed amplifier 222 in place of the amplifier 204 in FIG. 2A, and the bias circuit 220 also includes a load 224. The load 224 is electrically coupled as shown between the bias choke 208 and ground. The load 224 establishes an output impedance of the bias circuit 220 to match the impedance of the distributed amplifier 222. This bias circuit 220 also suffers from the same or similar drawbacks of the bias circuit 200 in FIG. 2A, due to the use of the bias choke 208.

To overcome the drawbacks of the circuits shown in FIGS. 2A and 2B and provide additional benefits, new active bias circuits are described herein. The active bias circuits or eliminate the conventional use of bias chokes through use of an active load circuit, which is configured to set the bias voltage at a desired level. By eliminating the bias chokes, the cost and size of the bias circuits can be reduced, and additional space can be made available for other circuit requirements.

Figure 3:
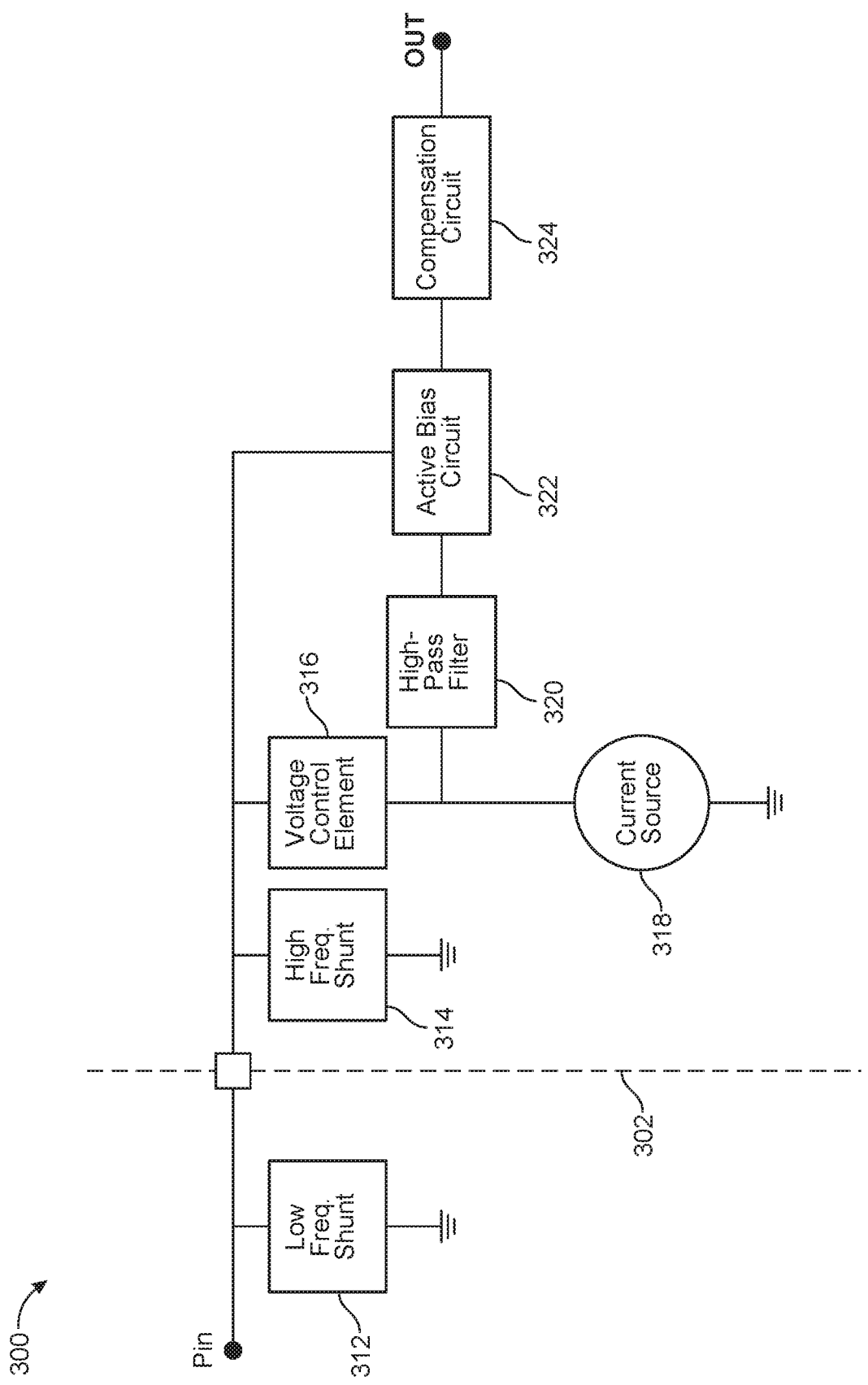
FIG. 3 illustrates a block diagram of an active bias circuit according to various aspects of the embodiments.

FIG. 3 illustrates a block diagram of an active bias circuit 300 according to various aspects of the embodiments. The bias circuit 300 can be used as the bias circuit 112 in the system 100 shown in FIG. 1, as one example, although the bias circuit 300 can also be used for a similar purpose in other systems. FIG. 3 is representative and illustrates one possible arrangement of circuit elements. Other arrangements are possible and within the scope of the embodiments, such as the inclusion of additional components not shown in FIG. 3 or the omission of one or more of the components shown in FIG. 3. The bias circuit 300 can be implemented in a variety of ways. For example, the components of the bias circuit 300 can be integrated together as a single integrated circuit formed on a single semiconductor chip, or the components can be spread among two or more chips, one or more circuit boards, or combinations of chips and circuit boards. In one example, the components illustrated to the left of the dashed line 302 in FIG. 3 can be implemented on a circuit board, and the components illustrated to the right of the dashed line 302 are formed on an integrated circuit or chip.

The bias circuit 300 includes a power input node Pin, a low frequency shunt 312, a high frequency shunt 314, a voltage control element 316, a current source 318, a high pass filter 320, an active bias circuit 322, a compensation circuit 324, and an output node, among possibly other components. When implemented with the system 100, the Pin node of the bias circuit 300 can be electrically coupled to an output of the power supply 106 shown in FIG. 1, for example, to provide a supply of power to the bias circuit 300. The output node of the bias circuit 300 can also be coupled to the driver 110 shown in FIG. 1, to supply power to the driver 110.

The low frequency shunt 312 can be embodied as a network of one or more capacitors, one or more resistors, or a combination of one or more resistors and one or more capacitors. The low frequency shunt 312 can be configured as a shunt to ground for relatively low frequency alternating signals. The high frequency shunt 314 can be embodied as a network of one or more capacitors, one or more resistors, or a combination of one or more resistors and one or more capacitors. The high frequency shunt 314 can be configured as a shunt to ground for relatively high frequency alternating signals. Thus, the low frequency shunt 312 and the high frequency shunt 314 can be designed, respectively, to bypass currents at certain frequencies to ground.

The low frequency shunt 312 and the high frequency shunt 314 can be respectively designed or tailored to shunt signals below any particular or suitable frequency, with the low frequency shunt 312 being designed to shunt signals at lower frequencies than the high frequency shunt 314. In the example shown in FIG. 3, the low frequency shunt 312 is implemented on a circuit board along with other components to the left of the dashed line 302, because capacitors and other circuit elements to shunt low frequency components to ground are typically larger and less suitable for integration. The high frequency shunt 314 is implemented on an integrated semiconductor chip along with the other components to the right of the dashed line 302, because capacitors and other circuit elements to shunt high frequency components (as compared to low frequency components) to ground are typically smaller and more suitable for integration. In other cases, both the low frequency shunt 312 and the high frequency shunt 314 can be integrated together on the same integrated semiconductor chip.

The voltage control element 316 is electrically coupled in series with the current source 318, from the power input node Pin to ground. The current source 318 is configured to draw current through the voltage control element 316. Among the embodiments, the current source 318 can be embodied by an arrangement of one or more transistors, active biased devices, resistors, etc., such as a current mirror or other circuit structure designed to draw a constant current regardless of the voltage across it. The current source 318 is configured to establish a predetermined and controllable current through the voltage control element 316, thereby providing a predetermined and controllable voltage drop across the voltage control element 316. In one embodiment, the voltage control element 316 can be embodied as a resistor, resistor network, active element, or any other circuit element which exhibits a voltage drop across it based on the flow of current through it. In some cases, the voltage control element 316 and the current source 318 can be combined into a single element which provides a voltage to the active bias circuit 322, as described below.

As shown in FIG. 3, the high-pass filter 320 is electrically connected, on one end, between the voltage control element 316 and the current source 318, and on another end, to the active bias circuit 322. The high-pass filter 320 is configured to set the low frequency operation of the active bias circuit 322. The high-pass filter 320 can be embodied as any type of high-pass filter network, including a resistor-capacitor (RC) network of one or more resistors and capacitors, although other types or configurations of filters may be used.

The high-pass filter 328 is configured to control which low frequency signals bypass the active bias circuit 330, thus setting the low frequency operation of the bias circuit 300. In one example, the high-pass filter 328 can be designed to extend the low frequency operation of the bias circuit 300 to as low as possible, although this extension of low frequency operation can be constrained by the physical size of the RC network in the high-pass filter 328. Larger resistances and capacitances in the RC network result in the need for larger resistor(s) and/or capacitor(s) in the RC network. In design variations, compromises or a balancing of factors may be relied upon, so that the resistor and capacitor values are large enough to meet low frequency operation demands while also minimizing the physical size of the RC network to the extent possible.

The active bias circuit 322 can be embodied as one or more active elements, including one or more transistors, configured to conduct current from the power input node Pin to the output node of the bias circuit 300. The active bias circuit 322 is thus configured to establish power for other circuits or circuit elements, such as a downstream driver/amplifier, including the driver 110 shown in FIG. 1. In one example, the active bias circuit 322 can be embodied as a single transistor, such as a field effect transistor (FET). The active bias circuit 322 is directed by the output of the high-pass filter 320, which is based on the voltage drop across the voltage control element 316. Responsive to the voltage potential between the voltage control element 316 and the current source 318, as filtered through the high-pass filter 328, the active bias circuit 322 is configured to provide a power bias from the power input node Pin to the compensation circuit 324 and, ultimately, to a downstream driver, amplifier, or other circuit elements.

The power bias at the output node of the bias circuit 300 is controlled by the voltage drop across the voltage control element 316, which is determined based on the current draw by the current source 318. In one example, the power bias can be adjustable, such as by a voltage control signal provided to the voltage control element 316, the current source 318, the high-pass filter 320, or directly to the active bias circuit 322, to provide additional control and flexibility, such as for use with different driver circuits or for power saving capability.

Figure 4A:
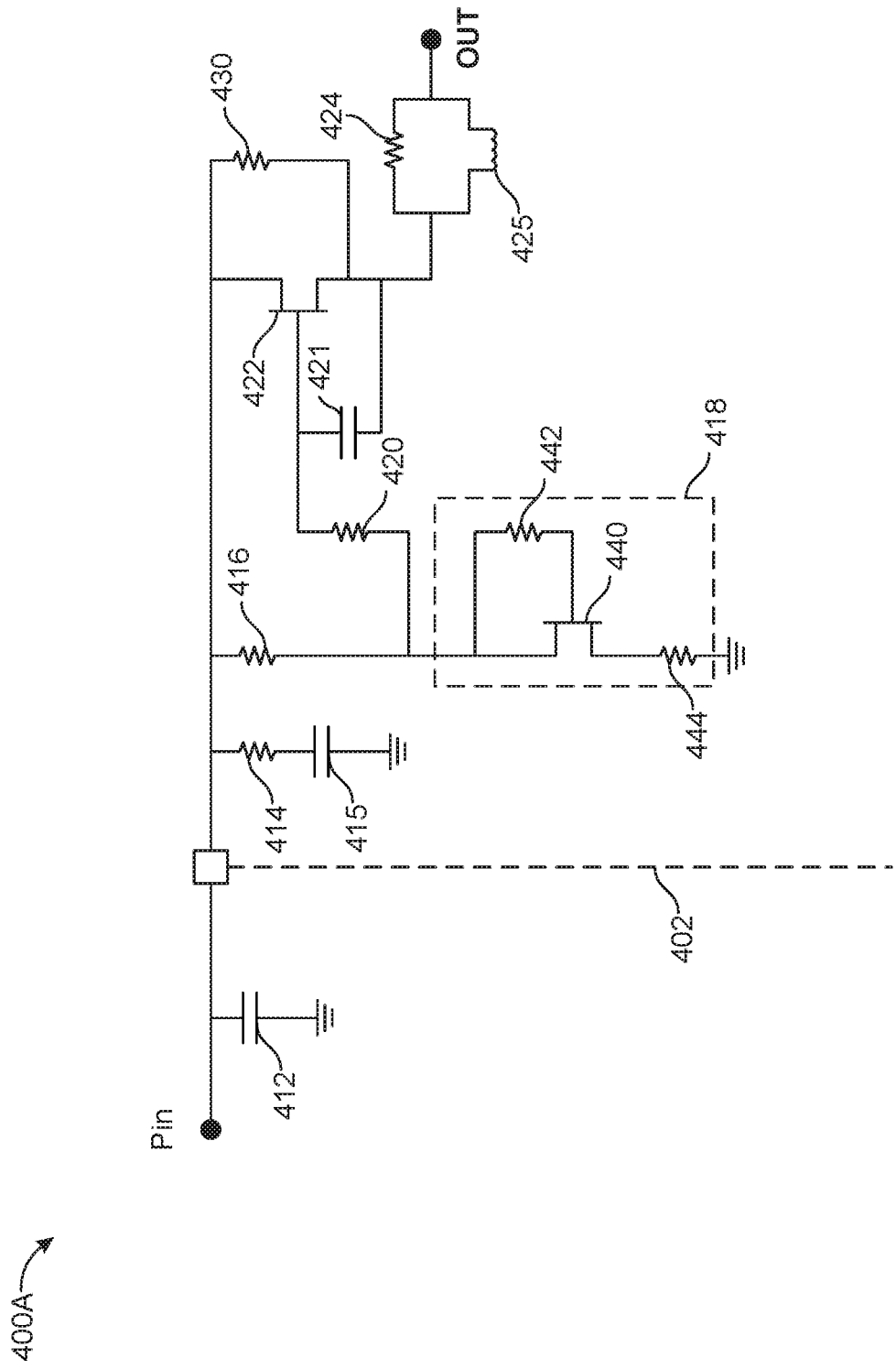
FIG. 4A illustrates a circuit diagram of an example active bias circuit according to various aspects of the embodiments.

FIG. 4A illustrates a circuit diagram of an example active bias circuit 400A according to various aspects of the embodiments. The bias circuit 400A can be used as the bias circuit 112 in the system 100 shown in FIG. 1, as one example, although the bias circuit 400A can also be used for a similar purpose in other systems. FIG. 4A is representative and illustrates one possible arrangement of circuit elements. Other arrangements are possible and within the scope of the embodiments, such as the inclusion of additional components not shown in FIG. 4A or the omission of one or more of the components shown in FIG. 4A. The bias circuit 400A can be implemented in a variety of ways. For example, the components of the bias circuit 400A can be integrated together as a single integrated circuit formed on a single semiconductor chip, or the components can be spread among two or more chips, one or more circuit boards, or combinations of chips and circuit boards. In one example, the components illustrated to the left of the dashed line 402A in FIG. 4A can be implemented on a circuit board, and the components illustrated to the right of the dashed line 402 can be formed on an integrated circuit or chip.

The bias circuit 400A includes a power input node Pin, a low frequency shunt capacitor 412, a high frequency shunt including a shunt resistor 414 and a shunt capacitor 415, a voltage control resistor 416, a current source 418, a high-pass filter including a resistor 420 and a high-pass capacitor 421, an active bias transistor 422, a compensation circuit including a compensation resistor 424 and a compensation inductor 425, a bypass resistor 430, and an output node, among possibly other components. When implemented with the system 100, the power input node Pin of the bias circuit 400A can be electrically coupled to an output of the power supply 106 shown in FIG. 1, for example, to provide a supply of power to the bias circuit 400A. The output node of the bias circuit 400A can also be coupled to the driver 110 shown in FIG. 1, to supply power to the driver 110.

As shown in FIG. 4A, the low frequency shunt capacitor 412 is configured to shunt and reduce low frequency signal components (but not the DC signal) at the Pin node to ground, to remove these components from the supply node. Thus, the low frequency shunt capacitor 412 is one example of the low frequency shunt 312 shown in FIG. 3. In the high frequency shunt, the resistor 414 and the high-pass capacitor 415 are electrically coupled in series from the Pin node to ground. The high frequency shunt is configured to shunt and reduce high frequency signal components (but not the DC signal) at the Pin node to ground, to remove these components from the supply node. Thus, the resistor 414 and the high-pass capacitor 415 are one example of the high frequency shunt 314 shown in FIG. 3.

The voltage control resistor 416 is electrically coupled in series with the current source 418, from the power input node Pin to ground. The voltage control resistor 416 is one example of the voltage control element 316 shown in FIG. 3, and the current source 418 is one example of the current source 318 shown in FIG. 3. The current source 418 is configured to draw current through the voltage control resistor 416, to develop a voltage potential across the voltage control resistor 416.

The voltage control resistor 416 can be manufactured at tight tolerances to maintain a consistent resistance among active biasing circuits. The resistance value for the voltage control resistor 416 can be typically selected as a relatively large value, so that most current drawn by the bias circuit 400A is directed through the active bias transistor 422. As examples, the voltage control resistor 416 can be embodied as a resistance of between 1000 ohms and 10,000 ohms, including resistances in increments of 1000 ohms (among other increments) between the stated range, such a 1100 ohms, 1200 ohms, 1300 ohms, 1400 ohms, and so on. The voltage control resistor 416 may be formed by any suitable structure(s) offered by a semiconductor process, such as thin film metal resistors or resistors formed in an epitaxial or implanted layer of semiconducting materials.

In the example shown in FIG. 4A, the current source 418 includes a transistor 440, a feedback resistor 444, and a voltage clamp resistor 442. In one implementation, the transistor 440 can be formed or embodied an enhancement mode transistor. The current source 418 generates a current, which establishes a voltage across the voltage control resistor 416. The amount of the voltage established across the voltage control resistor 416 is set or determined by the resistance of the voltage control resistor 416 and the current established by the current source 418. The current source 418 shown in FIG. 4A is one example of the current source 318 shown in FIG. 3.

In other embodiments, the current source 418 can be embodied by other arrangements of one or more transistors, active biased devices, resistors, etc., such as a current mirror or other circuit structure designed to draw a constant current regardless of the voltage across it. The current source 418 is configured to establish a predetermined and controllable current through the voltage control element 416, thereby providing a predetermined and controllable voltage drop across the voltage control resistor 416.

As shown in FIG. 4A, the resistor 420 and the high-pass capacitor 421 form a high-pass filter, and the resistor 420 and the high-pass capacitor 421 are one example of the high pass filter 320 shown in FIG. 3. The resistor 420 and the high-pass capacitor 421 are electrically connected, on one end, between the voltage control resistor 416 and the current source 418, and on another end, to the active bias transistor 422. The resistor 420 and the high-pass capacitor 421 are configured to set the low frequency operation of the active bias transistor 422. The resistor 420 and the high-pass capacitor 421 are configured to control which low frequency signals bypass the active bias transistor 422, thus setting the low frequency operation of the bias circuit 400A. In other words, the resistor 420 and the high-pass capacitor 421 set a high-pass frequency cutoff to control low frequency operation of the active bias circuit 400A. The high-pass capacitor 421 provides a short circuit for high frequencies between the gate and the source terminals of the active bias transistor 422.

The active bias transistor 422 can be embodied as a FET, configured to conduct current from the power input node Pin to the output node of the bias circuit 400A. The active bias transistor 422 is thus configured to establish power for other circuits or circuit elements coupled to the output node of the bias circuit 400A, such as the driver 110 shown in FIG. 1. While some voltage is dropped across the active bias transistor 422, it is typically lower than would be dropped across a fixed resistor, which is a further benefit over conventional techniques. In one implementation, and the active bias transistor 422 can be embodied as a depletion mode transistor. In the example shown, a bypass resistor 430 is provided in parallel with the active bias transistor 422, such that the performance of the bias circuit 400A is less sensitive to the active bias transistor 422. The resistance of the bypass resistor 430 can vary among the embodiments. Overall, the resistance of the bypass resistor 430 can be selected as a relatively small value, smaller than the resistance of the voltage control resistor 416. A resistance of the voltage control resistor 416 can be greater than the resistance of the bypass resistor 430. As examples, the bypass resistor 430 can be embodied as a resistance of between 100 ohms and 1000 ohms, including resistances in increments of 100 ohms (among other increments) between the stated range, such a 200 ohms, 300 ohms, 400 ohms, and so on. In some cases, the bypass resistor 430 can be omitted.

The flow of current through the active bias transistor 422 is directed or controlled based on the voltage drop across the voltage control resistor 416. Responsive to the voltage potential at a node between the voltage control resistor 416 and the current source 418, as filtered through the high-pass filter, the active bias transistor 422 is configured to provide a power bias from the power input node Pin to the compensation resistor 424 and the compensation inductor 425 and, ultimately, to other circuit elements at the output node of the bias circuit 400A. The power bias at the output node of the bias circuit 400A is thus controlled or directed by the voltage drop across the voltage control resistor 416, which is determined based on the current draw by the current source 418.

In operation, the active bias transistor 422 either provides or halts the flow of power to other circuits or circuit elements coupled to the output node of the bias circuit 400A, based on the voltage provided across the voltage control resistor 416. The voltage across the voltage control resistor 416 provides a fixed voltage across the drain to gate terminals of the active bias transistor 422. At the same time, the high-pass capacitor 421 appears as a short to high frequency signals, effectively shorting high frequency signals to the source terminal of the active bias transistor 422. Thus, the performance of the bias circuit 400A is much less sensitive to supply voltage variations or fluctuations on the power input node Pin. The active bias transistor 422 also appears as a fixed resistance, but has better performance and much less voltage drop across it (e.g., as compared to the resistor 206 in FIG. 2A). The corresponding power consumption or dissipation across the active bias transistor 422, as compared to the use of a fixed resistor, can be significantly lower.

The source terminal of the active bias transistor 422 is electrically coupled to a compensation circuit including a parallel arrangement of the compensation resistor 424 and the compensation inductor 425. The compensation resistor 424 and the compensation inductor 425 are one example of the compensation circuit 324 shown in FIG. 3. The active bias transistor 422 and the compensation circuit establish the output impedance of the active bias circuit 400A. The compensation resistor 424 and the compensation inductor 425 are configured to compensate for or tune out the parasitic capacitance in the active bias transistor 422. The overall output impedance of the active bias circuit 400A is determined by a combination of the output impedance of the active bias transistor 422, the compensation resistor 424, and the compensation inductor 425. In one example, the output impedance of the active bias circuit 400A can be designed for 50 ohms. In other embodiments, other output impedances may be established.

The compensation inductor 425 is much smaller in size as compared to the bias choke 208 shown in FIG. 2A, as a benefit to the active bias circuit 400A. For example, the bias choke 208 may have an inductance of 50 μH, while the compensation inductor 425 may have an inductance of about 0.5 nH, which is many orders of magnitude smaller. The output impedance of the active bias circuit 400A can be controlled over a wide range of frequencies. The operating frequency of the active bias circuit 400A can range from 100 KHz to 50 GHz, for example.

Figure 4B:
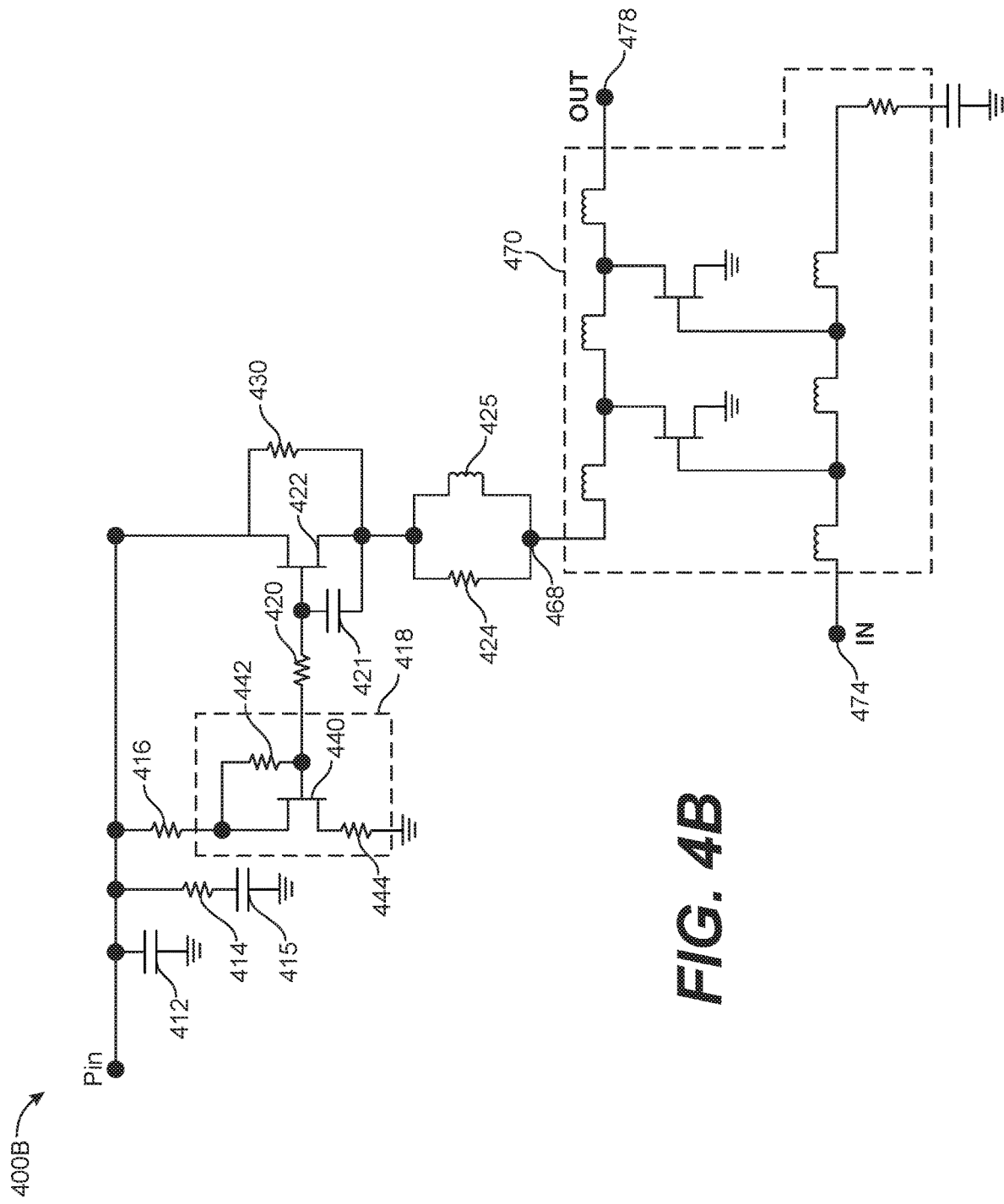
FIG. 4B illustrates a circuit diagram of another example active bias circuit with a distributed amplifier according to various aspects of the embodiments.

FIG. 4B illustrates a circuit diagram of another example active bias circuit 400B with a distributed amplifier 470 according to various aspects of the embodiments. The bias circuit 400B can be used as the bias circuit 112 in the system 100 shown in FIG. 1, and the distributed amplifier 470 can be used as the driver 110 in the system 100. FIG. 4B is representative and illustrates one possible arrangement of circuit elements. Other arrangements are possible and within the scope of the embodiments, such as the inclusion of additional components not shown in FIG. 4B or the omission of one or more of the components shown in FIG. 4B. The bias circuit 400B can be implemented in a variety of ways. For example, the components of the bias circuit 400B can be integrated together as a single integrated circuit formed on a single semiconductor chip, or the components can be spread among two or more chips, one or more circuit boards, or combinations of chips and circuit boards. As compared to FIG. 4A, the same elements are labeled with the same reference numbers.

One difference between the active bias circuit 400A shown in FIG. 4A and the active bias circuit 400B shown in FIG. 4B is that the resistor 420 of the high-pass filter is electrically coupled between the gate terminal of the transistor 440 and the gate terminal of the active bias transistor 422. In this case, the active bias transistor 422 is controlled based on the voltage drop across both the voltage control resistor 416 and the voltage clamp resistor 442, rather than the voltage drop across only the voltage control resistor 416 as in FIG. 4A.

In the example shown in FIG. 4B, the active bias circuit 400B is electrically coupled to the distributed amplifier 470. The distributed amplifier 470 includes an input terminal 474 and an output terminal 478. The input terminal 474 is configured to receive a data signal for transmission, such as from the data source 104 shown in FIG. 1. The output terminal 478 is configured to connect to an optical modulator, laser diode, or both, such as the optical modulator 114 and laser diode 116 shown in FIG. 1. The distributed amplifier 470 is biased or powered by the active bias circuit 400B through the connection to the bias output node 468, as shown in FIG. 4B. In this case, the distributed amplifier 470 acts as a driver for the optical modulator, laser diode, or both, such as the driver 110 shown in FIG. 1.

Figure 4C:
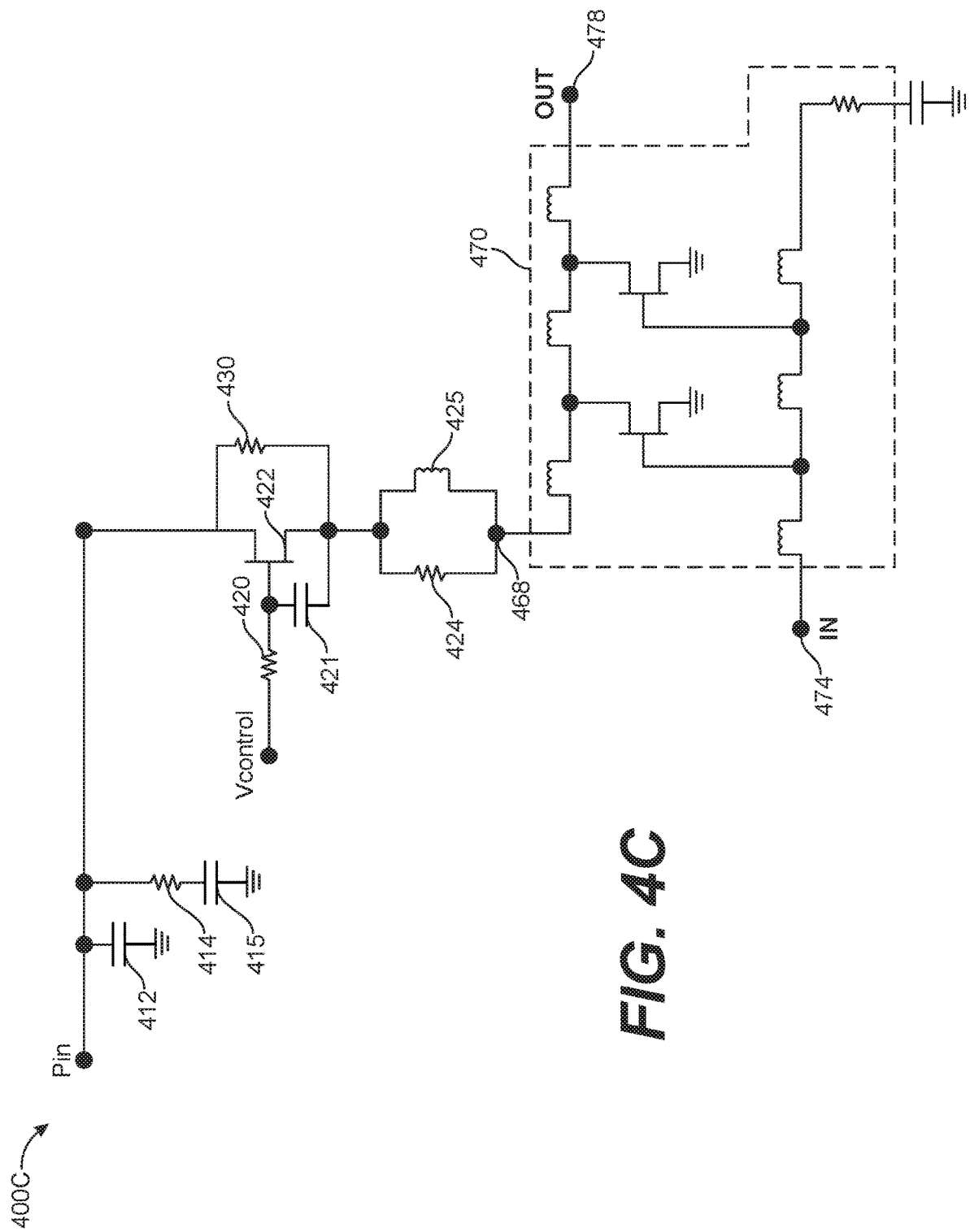
FIG. 4C illustrates a circuit diagram of another example active bias circuit with a distributed amplifier according to various aspects of the embodiments.

FIG. 4C illustrates a circuit diagram of another example active bias circuit 400C with a distributed amplifier 470 according to various aspects of the embodiments. The bias circuit 400C can be used to implement the bias circuit 112 and the driver 110 in the system 100 shown in FIG. 1. FIG. 4C is representative and illustrates one possible arrangement of circuit elements. Other arrangements are possible and within the scope of the embodiments, such as the inclusion of additional components not shown in FIG. 4C or the omission of one or more of the components shown in FIG. 4C. The bias circuit 400C can be implemented in a variety of ways. For example, the components of the bias circuit 400C can be integrated together as a single integrated circuit formed on a single semiconductor chip, or the components can be spread among two or more chips, one or more circuit boards, or combinations of chips and circuit boards. As compared to FIGS. 4A and 4B, the same elements are labeled with the same reference numbers.

As compared to the embodiment shown in FIG. 4A, the voltage control resistor 416 and the current source 418 are omitted. Thus, the active bias transistor 422 does not receive a control voltage across the voltage control resistor 416, as in the embodiment shown in FIG. 4A. Instead, a control voltage signal, Vcontrol, is provided as input to the active bias transistor 422. In this case, the power bias provided to the distributed amplifier 470 by the active bias transistor 422 can be adjustable over time, based on Vcontrol. Vcontrol is also filtered by the high-pass filter including the resistor 420 and the high-pass capacitor 421, as shown in FIG. 4C. In some cases, the resistor 420, the high-pass capacitor 421, or both can be omitted.

Vcontrol can be generated by a voltage control element, such as an integrated controller, to provide additional control and flexibility. In this case, the voltage control element can be embodied as a general purpose, integrated processor or processing circuit, or an integrated application specific integrated circuit (ASIC), with memory, for controlling the operation of the active bias transistor 422 over time. The voltage control element also controls the power bias provided by the active bias transistor 422 to the distributed amplifier 470 over time, based on Vcontrol.

Generally, the controller 200 is configured to control the operations of and tune and monitor the configuration and status of the optical transmitter 220. For example, through the local interface 280 with the optical transmitter 220 and/or the local interface 281 with the driver 270, the controller 200 is configured to control and monitor the temperature, output power, and other operating characteristics and parameters of the optical transmitter 220. To that end, as shown in FIG. 1, the controller 200 includes a timer 210, an event detector 211, a link estimator 212, a power calculator 213, a tuning module 214, and a memory 215, among other elements. The operations and functions of the controller 200 are described in further detail below.

Figure 4D:
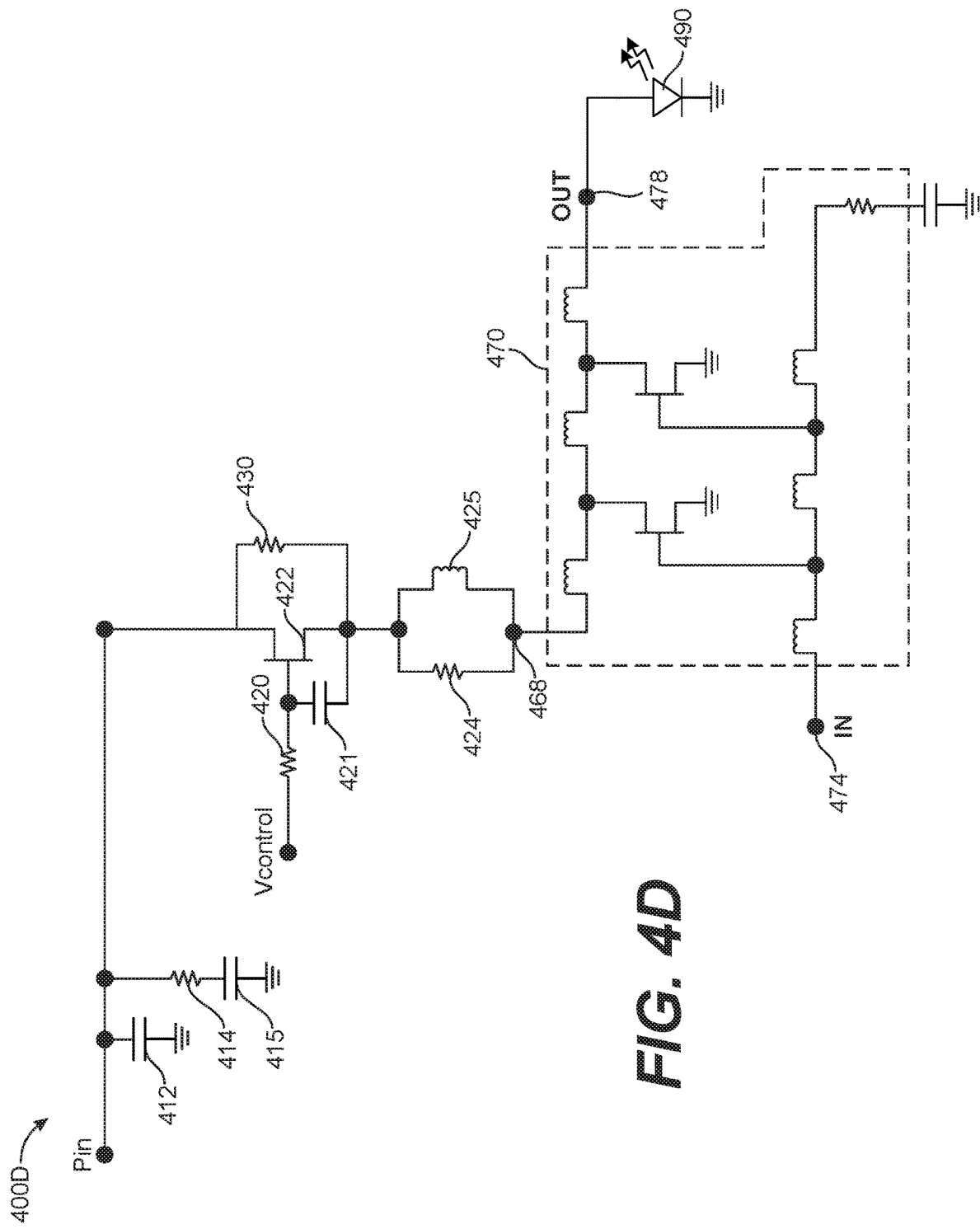
FIG. 4D illustrates a circuit diagram of another example active bias circuit with a distributed amplifier and a directly modulated laser according to various aspects of the embodiments.

FIG. 4D illustrates a circuit diagram of another example active bias circuit 400D with a distributed amplifier 470 and a directly modulated laser 490 according to various aspects of the embodiments. The bias circuit 400D can be used to implement the bias circuit 112, the driver 110, and the laser diode 116 in the system 100 shown in FIG. 1. FIG. 4D is representative and illustrates one possible arrangement of circuit elements. Other arrangements are possible and within the scope of the embodiments, such as the inclusion of additional components not shown in FIG. 4D or the omission of one or more of the components shown in FIG. 4D. The bias circuit 400D can be implemented in a variety of ways. For example, the components of the bias circuit 400D can be integrated together as a single integrated circuit formed on a single semiconductor chip, or the components can be spread among two or more chips, one or more circuit boards, or combinations of chips and circuit boards. As compared to FIGS. 4A-4C, the same elements are labeled with the same reference numbers.

As compared to the embodiment shown in FIG. 4D, the active bias circuit 400D further includes the laser diode 490. The laser diode 490 is one example of the laser diode 116 shown in FIG. 1. The laser diode 490 is directly modulated by the distributed amplifier 470, as shown in FIG. 1, without the need for an optical modulator. Thus, the laser diode 490 is an example of a DML, in the configuration shown. The power bias provided to the distributed amplifier 470 by the active bias transistor 422 is adjustable over time, based on Vcontrol. As in FIG. 4C, Vcontrol is also filtered by the high-pass filter including the resistor 420 and the high-pass capacitor 421. Vcontrol can be generated by a controller, for example, to provide additional control and flexibility, such as for use with different driver circuits or for power saving capability.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

What is claimed is:

1. An active bias circuit, comprising:
   a voltage control element to establish a control voltage;
   an active bias device to provide a power bias from a power supply based on the control voltage; and
   a compensation circuit coupled to receive the power bias from the active bias device, the compensation circuit configured to set an output impedance of the active bias circuit and to compensate for parasitic capacitance of the active bias device.

2. The active bias circuit of claim 1, further comprising a current source connected in series with the voltage control element, to establish the control voltage across the voltage control element.

3. The active bias circuit of claim 1, further comprising a high-pass filter between the voltage control element and the active bias device, the high-pass filter setting low frequency operation for the active bias circuit.

4. The active bias circuit of claim 3, wherein:
   the active bias circuit comprises an active bias transistor; and
   the high-pass filter comprises a resistor-capacitor (RC) network between the voltage control element and a gate of the active bias transistor.

5. The active bias circuit of claim 1, wherein the compensation circuit comprises a parallel arrangement of a resistor and an inductor coupled in series between the active bias circuit and the driver.

6. The active bias circuit of claim 1, further comprising a bypass resistor coupled in parallel with the active bias device.

7. The active bias circuit of claim 6, wherein:
   the voltage control element comprises a voltage control resistor; and
   a resistance of the voltage control resistor is greater than a resistance of the bypass resistor.

8. The active bias circuit of claim 1, further comprising a high frequency shunt coupled between the power supply and ground.

9. An optical transmitter, comprising:
   a laser diode;
   a bias circuit configured to provide a power bias, the bias circuit comprising:
      a voltage control element to establish a control voltage; and an active bias device to provide the power bias based on the control voltage;

a compensation circuit coupled to receive the power bias from the active bias device; and a driver coupled to receive the power bias from the compensation circuit and configured to provide a driving bias to the laser diode based on input data.

10. The optical transmitter of claim 9, wherein the compensation circuit is coupled in series between the active bias device and the driver.

11. The optical transmitter of claim 10, wherein the compensation circuit comprises a parallel arrangement of a resistor and an inductor coupled in series between the active bias device and the driver.

12. The optical transmitter of claim 10, wherein the compensation circuit is configured to set an output impedance of the active bias device and to compensate for parasitic capacitance of the active bias device.

13. The optical transmitter of claim 9, wherein the optical transmitter further comprises a current source connected in series with the voltage control element, to establish the control voltage across the voltage control element.

14. The optical transmitter of claim 9, wherein the optical transmitter further comprises a high-pass filter between the voltage control element and the active bias device, the high-pass filter setting low frequency operation for the active bias device.

15. The optical transmitter of claim 14, wherein:
the bias circuit comprises an active bias transistor; and
the high-pass filter comprises a resistor-capacitor (RC) network between the voltage control element and a gate of the active bias transistor.

16. The optical transmitter of claim 14, wherein the bias circuit further comprises a bypass resistor coupled in parallel with the active bias device.

17. The optical transmitter of claim 16, wherein:
the voltage control element comprises a voltage control resistor; and
a resistance of the voltage control resistor is greater than a resistance of the bypass resistor.

18. The optical transmitter of claim 9, further comprising a high frequency shunt coupled between a power supply and ground.

19. An active bias circuit, comprising:
a voltage control element;
a current source connected in series with the voltage control element, to establish a control voltage across the voltage control element;
an active bias device to provide a power bias from a power supply based on the control voltage;
a high-pass filter coupled between the voltage control element and the active bias device; and
a compensation circuit coupled to receive the power bias from the active bias device, the compensation circuit configured to set an output impedance of the active bias circuit and to compensate for parasitic capacitance of the active bias device.

20. The active bias circuit of claim 19, wherein the compensation circuit comprises a parallel arrangement of a resistor and an inductor.

\* \* \* \* \*